US011728802B2

United States Patent
Watanabe (10) Patent No.: US 11,728,802 B2
(45) Date of Patent: Aug. 15, 2023

(54) DRIVE CIRCUIT

(71) Applicant: DENSO CORPORATION, Kariya (JP)

(72) Inventor: Yosuke Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/165,504

(22) Filed: Feb. 2, 2021

(65) Prior Publication Data

US 2021/0159897 A1 May 27, 2021

Related U.S. Application Data

(63) Continuation of application No. PCT/JP2019/026205, filed on Jul. 2, 2019.

(30) Foreign Application Priority Data

Aug. 6, 2018 (JP) .................. 2018-147791

(51) Int. Cl.
| | |
|---|---|
| *H03K 17/0812* | (2006.01) |
| *H02M 1/08* | (2006.01) |
| *H02M 7/5387* | (2007.01) |
| *H02P 27/08* | (2006.01) |

(52) U.S. Cl.
CPC .......... *H03K 17/0812* (2013.01); *H02M 1/08* (2013.01); *H02M 7/53871* (2013.01); *H02P 27/08* (2013.01)

(58) Field of Classification Search
CPC ........ H02M 1/00; H02M 1/007; H02M 1/008; H02M 1/08; H02M 1/32; H02M 3/00; H02M 3/158; H02M 7/00; H02M 7/53871; H02P 27/00; H02P 27/08; H03K 17/00; H03K 17/04126; H03K 17/063; H03K 17/0812; H03K 17/0826; H03K 17/0828; H03K 17/601; H03K 2217/00; H03K 2217/0036
USPC ......................................................... 327/109
See application file for complete search history.

(56) References Cited

U.S. PATENT DOCUMENTS

| | | | | |
|---|---|---|---|---|
| 2008/0316773 | A1* | 12/2008 | Neubarth | H02M 3/3384 363/21.02 |
| 2014/0218099 | A1* | 8/2014 | Yamada | H03K 17/0412 327/482 |
| 2017/0033790 | A1* | 2/2017 | Osanai | H03K 17/08128 |
| 2018/0019739 | A1 | 1/2018 | Kondo et al. | |

FOREIGN PATENT DOCUMENTS

JP 2016-134998 A 7/2016

* cited by examiner

*Primary Examiner* — Diana J. Cheng
*Assistant Examiner* — Dave Mattison
(74) *Attorney, Agent, or Firm* — Oliff PLC (57) ABSTRACT

A drive circuit includes a plurality of first control wirings, a plurality of first balance resistors, a first common wiring, a first switch, a plurality of second control wirings, a plurality of second balance resistors, a second common wiring, a second switch, a sensor configured to detect a fault in controlled switches, and a controller configured to control opening and closing of the first switch when the sensor detects no fault, and control opening and closing of the second switch when the sensor detects the fault.

9 Claims, 3 Drawing Sheets

DRIVE CIRCUIT

CROSS REFERENCE TO RELATED APPLICATIONS

The present application is a continuation application of International Patent Application No. PCT/JP2019/026205 filed on Jul. 2, 2019, which designated the U.S. and claims the benefit of priority from Japanese Patent Application No. 2018-147791 filed on Aug. 6, 2018. The entire disclosures of all of the above applications are incorporated herein by reference.

TECHNICAL FIELD

The present disclosure relates to a drive circuit.

BACKGROUND

Conventionally, there has been known a drive circuit that controls the drive of a plurality of controlled switches connected in parallel.

SUMMARY

The present disclosure provides a drive circuit including a plurality of first control wirings, a plurality of first balance resistors, a first common wiring, a first switch, a plurality of second control wirings, a plurality of second balance resistors, a second common wiring, a second switch, a sensor configured to detect a fault that has occurred in controlled switches, and a controller configured to control opening and closing of the first switch when the sensor detects no fault, and control the second switch to be closed when the sensor detects the fault.

BRIEF DESCRIPTION OF DRAWINGS

Objects, features and advantages of the present disclosure will become apparent from the following detailed description made with reference to the accompanying drawings. In the drawings.

DETAILED DESCRIPTION

There is a control device that controls the drive of two arm switches connected in parallel.

In the control device, two gate electrodes are electrically connected. Therefore, there is a possibility that parasitic resonance may occur in an electric path connecting the two gate electrodes due to capacitances of the gate electrodes and an inductance of a wiring.

For example, when a fault such as a short circuit occurs, a current larger than when the arm switches are normally driven flows into the electric path connecting the gate electrodes via parasitic capacitances of the arm switches. This may cause the parasitic resonance in the electrical path. When the parasitic resonance occurs in the electric path, voltages of the arm switches may exceed breakdown voltages or a fault may occur, and the arm switches (controlled switches) may be damaged.

A drive circuit according to an aspect of the present disclosure includes a plurality of first control wirings, a plurality of first balance resistors, a first common wiring, a first switch, a plurality of second control wirings, a plurality of second balance resistors, a second common wiring, a second switch, a sensor, and a controller. The first control wirings are connected to respective control electrodes of a plurality of controlled switches that are connected in parallel between a first connection point and a second connection point between which there is a potential difference. The first balance resistors are provided on the first control wirings, respectively. The first common wiring is connected to the first control wirings in common, and connects the control electrodes to a reference potential via the first balance resistors, respectively. The first switch is provided on the first common wiring. The second control wirings are connected to portions of the first control wirings that are connected to ends of the first balance resistors close to the control electrodes, respectively. The second balance resistors are provided on the second control wirings, respectively. The second common wiring is connected to the second control wirings in common, and connects the control electrodes to the reference potential via the second balance resistors, respectively. The second switch is provided on the second common wiring. The sensor is configured to detect a fault that has occurred in the controlled switches. The controller is configured to control opening and closing of the first switch when the sensor detects no fault, and control the second switch to be closed when the sensor detects the fault. Each of the controlled switches is configured to be opened when the control electrode is connected to the reference potential. A resistance value obtained by combining resistance values of the second balance resistors is higher than a resistance value obtained by combining resistance values of the first valance resistors.

According to the above aspects, when a fault is detected by the sensor, the second switch is closed. The electric charges accumulated in the control electrodes of the controlled switches tend to flow to the reference potential via the second balance resistors and the second switch. At this time, since the electric charges tend to flow toward the second switch, the current tends to flow between the control electrodes of the controlled switches through the second balance resistors instead of the first balance resistors.

The combined resistance value of the second balance resistors is higher than the combined resistance value of the first balance resistors. Therefore, the occurrence of parasitic resonance due to the capacitances of the control electrodes and the inductance of the control wirings can be suppressed between the control electrodes of the controlled switches via the second balance resistors. As a result, an excess of a breakdown voltage and a fault in the controlled switches can be suppressed. Therefore, damage to the controlled switches can be suppressed.

If no fault is detected by the sensor, the first switch is controlled to open and close. When the first switch is closed, the electric charges accumulated in the control electrodes of the controlled switches tend to flow to the reference potential via the first balance resistors and the first switch. The combined resistance value of the first balance resistors is lower than the combined resistance value of the second balance resistors. Therefore, when controlling the drive of the controlled switch in the normal state, it is possible to suppress an increase in time (delay time) required to open the controlled switches.

Embodiments will be described below with reference to the drawings.

First Embodiment

An in-vehicle system 100 will be described with reference to FIG. 1. The in-vehicle system 100 is a system for an electric vehicle. The in-vehicle system 100 includes a battery 200, a power converter 300, and a motor 400.

The in-vehicle system 100 includes a plurality of electronic control units (ECUs). In FIG. 1, a battery ECU 501 and an MGECU 502 are shown as representatives of the ECUs. The ECUs transmit and receive signals to and from each other via a bus wiring 500. The ECUs cooperate to control an electric vehicle. The ECUs control the regeneration and power running of the motor 400 according to a state of charge (SOC) of the battery 200.

Each of the ECUs includes at least one calculation processing unit (CPU) and at least one memory device (MMR) as a storage medium storing a program and data. Each of the ECUs includes a microcontroller including a storage medium readable by a computer. The storage medium is a non-transitory tangible storage medium that temporarily stores a computer readable program. The storage medium may include a semiconductor memory, a magnetic disk, or the like. Hereinafter, the components of the in-vehicle system 100 will be described individually.

The battery 200 has a plurality of secondary batteries. The secondary batteries form a battery stack connected in series. The SOC of the battery stack corresponds to the SOC of the battery 200. As the secondary batteries, a lithium ion secondary battery, a nickel hydrogen secondary battery, an organic radical battery, or the like can be adopted.

The power converter 300 performs power conversion between the battery 200 and the motor 400. The power converter 300 converts the DC power of the battery 200 into AC power at a voltage level suitable for the power running of the motor 400. The power converter 300 converts the AC power generated by the power generation (regeneration) of the motor 400 into DC power having a voltage level suitable for charging the battery 200. The power converter 300 will be described in detail later.

The motor 400 is connected to an output shaft of an electric vehicle which is not shown. The rotational energy of the motor 400 is transmitted to traveling wheels of the electric vehicle via the output shaft. On the contrary, the rotational energy of the traveling wheels is transmitted to the motor 400 via the output shaft.

The motor 400 is powered by the AC power supplied from the power converter 300. Accordingly, propulsive force is applied to the traveling wheels. Further, the motor 400 is regenerated by the rotational energy transmitted from the traveling wheels. The AC power generated by this regeneration is converted into DC power by the power converter 300 and is stepped down. This DC power is supplied to the battery 200. The DC power is also supplied to various electric loads mounted on the electric vehicle.

The power converter 300 will be described. The power converter 300 includes a converter 310 and an inverter 320. The converter 310 steps up (boosts) the DC power of the battery 200 to a voltage level suitable for the power running of the motor 400. The inverter 320 converts the DC power into AC power. This AC power is supplied to the motor 400. Further, the inverter 320 converts the AC power generated by the motor 400 into DC power. The converter 310 steps down the DC power to a voltage level suitable for charging the battery 200.

Figure 1:
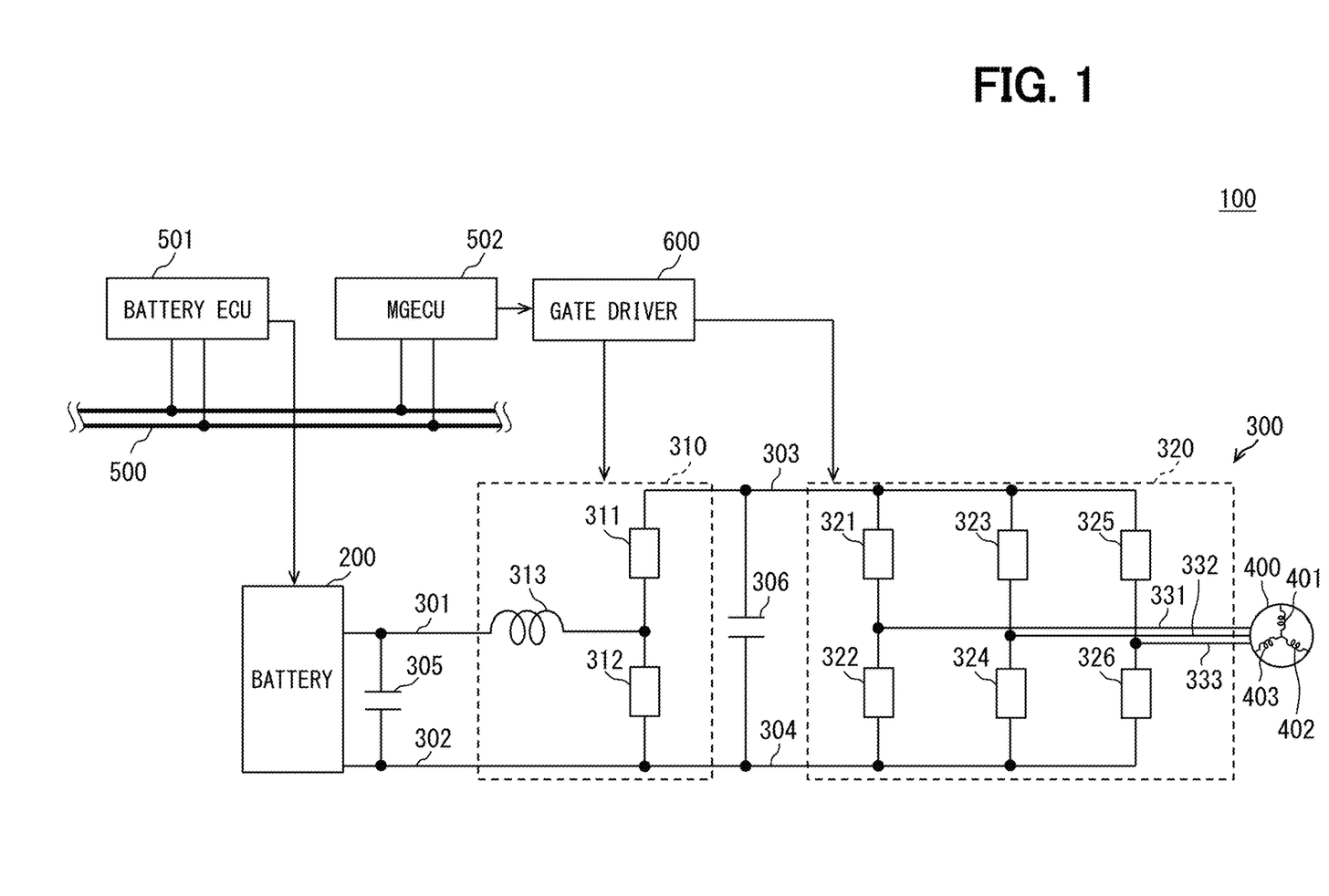
FIG. 1 is a circuit diagram illustrating an in-vehicle system.

As shown in FIG. 1, the converter 310 is electrically connected to the battery 200 via a first power line 301 and a second power line 302. The converter 310 is electrically connected to the inverter 320 via a third power line 303 and a fourth power line 304.

The first power line 301 is connected to a positive electrode of the battery 200. The second power line 302 is connected to a negative electrode of the battery 200. The first power line 301 and the second power line 302 are connected with a first smoothing capacitor 305. One of two electrodes of the first smoothing capacitor 305 is connected to the first power line 301, and the other is connected to the second power line 302.

The third power line 303 is connected to a high-side opening and closing unit 311. The fourth power line 304 is connected to the second power line 302. The third power line 303 and the fourth power line 304 are connected with a second smoothing capacitor 306. One of two electrodes of the second smoothing capacitor 306 is connected to the third power line 303, and the other is connected to the fourth power line 304.

The inverter 320 is electrically connected to a U-phase stator coil 401 to a W-phase stator coil 403 of the motor 400 via a U-phase bus bar 331 to a W-phase bus bar 333. The notation of the U-phase bus bar 331 to the W-phase bus bar 333 indicates the U-phase bus bar 331, a V-phase bus bar 332, and the W-phase bus bar 333. The notation of the U-phase stator coil 401 to the W-phase stator coil 403 indicates the U-phase stator coil 401, a V-phase stator coil 402, and the W-phase stator coil 403.

The converter 310 includes the high-side opening and closing unit 311, a low-side opening and closing unit 312, and a reactor 313. Each of the high-side opening and closing unit 311 and the low-side opening and closing unit 312 includes an N-channel MOSFET and an IGBT connected in parallel, as will be described in detail later. The MOSFET has a parasitic diode. The IGBT is connected in antiparallel with a freewheeling diode.

As shown in FIG. 1, the high-side opening and closing unit 311 and the low-side opening and closing unit 312 are connected in series in a direction from the third power line 303 toward the second power line 302 (fourth power line 304). The first power line 301 is connected to a midpoint between the high-side opening and closing unit 311 and the low-side opening and closing unit 312. The reactor 313 is provided on the first power line 301. Accordingly, the reactor 313 is connected to the midpoint between the high-side opening and closing unit 311 and the low-side opening and closing unit 312 and the positive electrode of the battery 200.

The high-side opening and closing unit 311 and the low-side opening and closing unit 312 of the converter 310 are controlled by the MGECU 502. The MGECU 502 generates a control signal and outputs the control signal to a gate driver 600. The gate driver 600 amplifies the control signal and outputs the amplified control signal to a gate electrode of a switch. Accordingly, the MGECU 502 steps up or down the voltage level of the DC power input to the converter 310.

The MGECU 502 generates a pulse signal as the control signal. The MGECU 502 adjusts a step-up/down level of DC power by adjusting an on-duty ratio and a frequency of the pulse signal. In this way, the MGECU 502 performs PWM control of the converter 310. The step-up/down level is determined according to the target torque of the motor 400 and the SOC of the battery 200.

When stepping up the DC power of the battery 200, the MGECU 502 alternately opens and closes the high-side opening and closing unit 311 and the low-side opening and closing unit 312. On the contrary, when steeping down the DC power supplied from the inverter 320, the MGECU 502 fixes the control signal output to the low-side opening and closing unit 312 to a low level. At the same time, the MGECU 502 sequentially switches the control signal output to the high-side opening and closing unit 311 between a high level and a low level.

The inverter 320 has a first opening and closing unit 321 to a sixth opening and closing unit 326. Each of the first opening and closing unit 321 to the sixth opening and closing unit 326 includes an N-channel MOSFET and an IGBT connected in parallel in the same manner as the opening and closing units of the converter 310. The MOSFET has a parasitic diode. The IGBT is connected in antiparallel with a freewheeling diode. The notation of the first opening and closing unit 321 to the sixth opening and closing unit 326 indicates the first opening and closing unit 321, a second opening and closing unit 322, a third opening and closing unit 323, a fourth opening and closing unit 324, a fifth opening and closing unit 325, and the sixth opening and closing unit 326.

The first opening and closing unit 321 and the second opening and closing unit 322 are sequentially connected in series in a direction from the third power line 303 toward the fourth power line 304. The first opening and closing unit 321 and the second opening and closing unit 322 constitute a U-phase leg. One end of the U-phase bus bar 331 is connected to a midpoint between the first opening and closing unit 321 and the second opening and closing unit 322. The other end of the U-phase bus bar 331 is connected to the U-phase stator coil 401 of the motor 400.

The third opening and closing unit 323 and the fourth opening and closing unit 324 are sequentially connected in series in the direction from the third power line 303 toward the fourth power line 304. The third opening and closing unit 323 and the fourth opening and closing unit 324 constitute a V-phase leg. One end of the V-phase bus bar 332 is connected to a midpoint between the third opening and closing unit 323 and the fourth opening and closing unit 324. The other end of the V-phase bus bar 332 is connected to the V-phase stator coil 402 of the motor 400.

The fifth opening and closing unit 325 and the sixth opening and closing unit 326 are sequentially connected in series in the direction from the third power line 303 toward the fourth power line 304. The fifth opening and closing unit 325 and the sixth opening and closing unit 326 constitute a W-phase leg. One end of the W-phase bus bar 333 is connected to a midpoint between the fifth opening and closing unit 325 and the sixth opening and closing unit 326. The other end of the W-phase bus bar 333 is connected to the W-phase stator coil 403 of the motor 400.

The inverter 320 has the three-phase legs respectively corresponding to the U-phase stator coil 401 to the W-phase stator coil 403 of the motor 400. The control signal of the MGECU 502 amplified by the gate driver 600 is input to the gate electrodes of the first opening and closing unit 321 to the sixth opening and closing unit 326 constituting the three-phase legs.

When powering the motor 400, the first opening and closing unit 321 to the sixth opening and closing unit 326 are PWM-controlled by the output of the control signal from the MGECU 502. Accordingly, three-phase alternating current is generated in the inverter 320. When the motor 400 generates (regenerates) electricity, the MGECU 502 stops the output of the control signal, for example. Accordingly, the AC power generated by the power generation of the motor 400 passes through the diodes in the opening and closing units. As a result, the AC power is converted to DC power.

Figure 2:
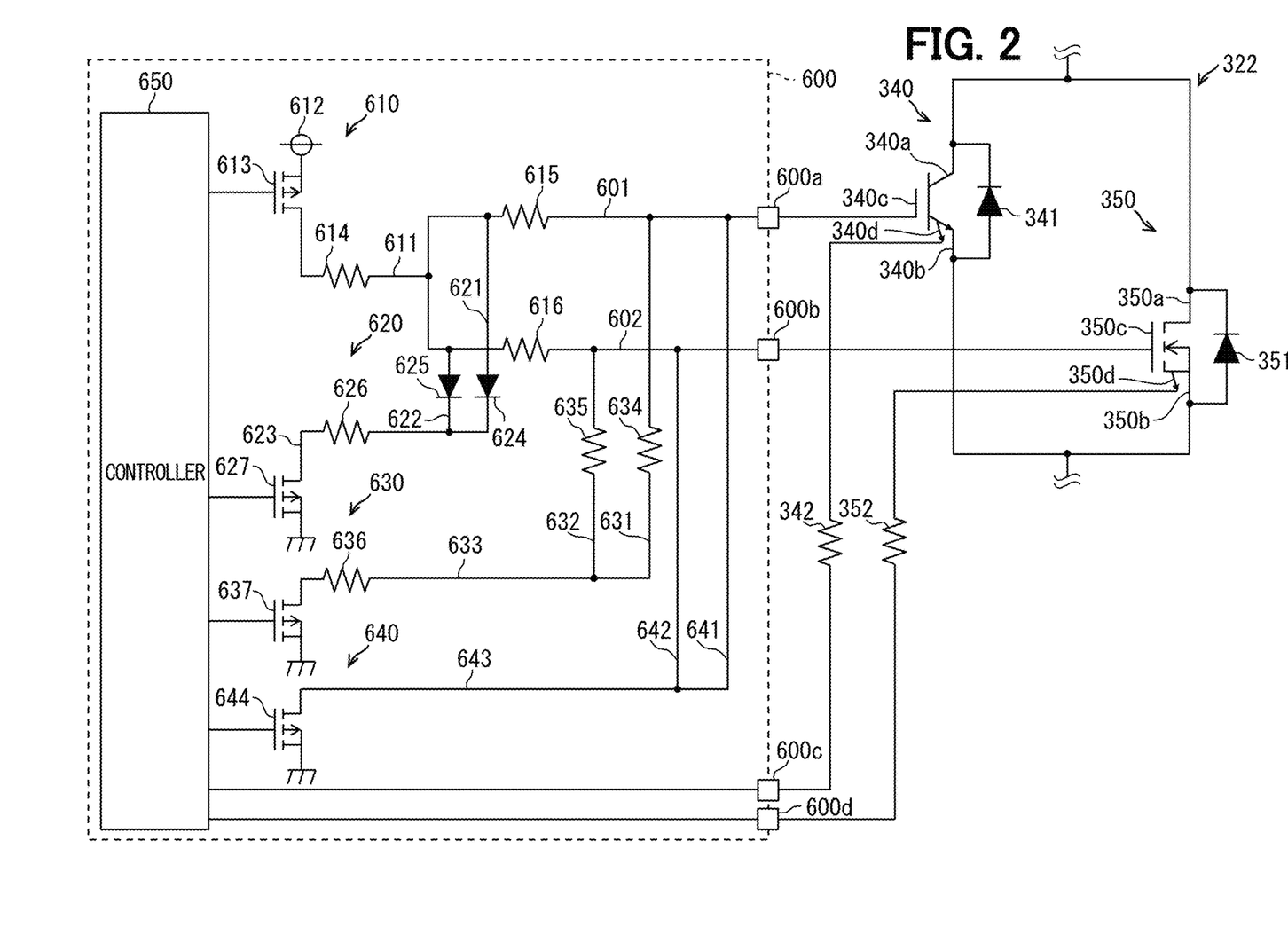
FIG. 2 is a circuit diagram for explaining an opening and closing unit and a gate driver.

The opening and closing units will be described with reference to FIG. 2. FIG. 2 shows the second opening and closing unit 322 as a representative of the eight opening and closing units constituting the power converter 300. The configurations of the other opening and closing units are the same as the configuration of the second opening and closing unit 322. Therefore, the description thereof will be omitted.

The second opening and closing unit 322 includes an IGBT 340 and a MOSFET 350. The IGBT 340 is made of a semiconductor. The MOSFET 350 is made of a wide-gap semiconductor. In the present embodiment, the IGBT 340 is made of Si. The MOSFET 350 is made of SiC. The MOSFET 350 has a shorter turn-on delay time and a shorter turn-off delay time than the IGBT 340. The MOSFET 350 has a higher withstand current performance than the IGBT 340. The IGBT 340 corresponds to a first controlled switch. The MOSFET 350 corresponds to a second controlled switch.

Each of the IGBT 340 and the MOSFET 350 is a power transistor formed by connecting thousands of transistors formed on a semiconductor chip. The thousands of transistors are classified into a first transistor that plays a role of controlling the current flowing through the power converter 300 and a second transistor that plays a role of detecting the flowing current.

The ratio of the current flowing through the first transistor to the current flowing through the second transistor is approximately 8000:1. Therefore, the amount of current flowing through the second transistor is very small.

The IGBT 340 includes a collector electrode 340a, an emitter electrode 340b, a gate electrode 340c, and a sensor electrode 340d. In the four electrodes, the collector electrode 340a and the gate electrode 340c are shared by the first transistor and the second transistor. On the other hand, the emitter electrode 340b and the sensor electrode 340d are separated by the first transistor and the second transistor. The first transistor includes the emitter electrode 340b. The second transistor includes the sensor electrode 340d. The amount of current flowing through the sensor electrode 340d is smaller than the amount of current flowing through the emitter electrode 340b. The ratio is 1:8000. In the following, this ratio is referred to as the sensor ratio. The MGECU 502 stores this sensor ratio.

The MOSFET 350 includes a drain electrode 350a, a source electrode 350b, a gate electrode 350c, and a sensor electrode 350d. In the four electrodes, the drain electrode 350a and the gate electrode 350c are shared by the first transistor and the second transistor. On the other hand, the source electrode 350b and the sensor electrode 350d are separated by the first transistor and the second transistor. The first transistor includes the source electrode 350b. The second transistor includes the sensor electrode 350d. The amount of current flowing through the sensor electrode 350d is smaller than the amount of current flowing through the source electrode 350b. The ratio is equivalent to the above-described sensor ratio.

As shown in FIG. 2, The IGBT 340 is connected to a freewheeling diode 341. A cathode electrode of the freewheeling diode 341 is connected to the collector electrode 340a. An anode electrode of the freewheeling diode 341 is connected to the emitter electrode 340b. Accordingly, the freewheeling diode 341 is connected in antiparallel to the IGBT 340.

The MOSFET 350 has a parasitic diode 351. A cathode electrode of the parasitic diode 351 is connected to the drain electrode 350a. An anode electrode of the parasitic diode 351 is connected to the source electrode 350b. Accordingly, the parasitic diode 351 is connected in antiparallel to the MOSFET 350.

As shown in FIG. 2, the collector electrode 340a of the IGBT 340 and the drain electrode 350a of the MOSFET 350 are electrically connected. The emitter electrode 340b and the source electrode 350b are electrically connected. Accordingly, the IGBT 340 and the MOSFET 350 are connected in parallel.

A connection point between the collector electrode 340a and the drain electrode 350a is located close to the third power line 303. A connection point between the emitter electrode 340b and the source electrode 350b is located close to the fourth power line 304 (the second power line 302). The connection point between the collector electrode 340a and the drain electrode 350a corresponds to a first connection point. The connection point between the emitter electrode 340b and the source electrode 350b corresponds to a second connection point.

The sensor electrode 340d of the IGBT 340 is connected to a first sensor terminal 600c of the gate driver 600 via a first sensor resistor 342. A small amount of current depending on the current (collector current) flowing between the collector and the emitter of the IGBT 340 flows through the first sensor resistor 342. Accordingly, a voltage (sensor voltage) at an end of the first sensor resistor 342 close to the sensor electrode 340d fluctuates.

The sensor voltage of the first sensor resistor 342 is input to the MGECU 502 via a controller 650. The MGECU 502 stores a resistance value of the first sensor resistor 342. The MGECU 502 detects the collector current based on the input voltage, the stored resistance value, and the sensor ratio.

The sensor electrode 350d of the MOSFET 350 is connected to a second sensor terminal 600d of the gate driver 600 via a second sensor resistor 352. A small amount of current depending on the current (drain current) flowing between the drain and the source of the MOSFET 350 flows through the second sensor resistor 352. Accordingly, a voltage (sensor voltage) at an end of the second sensor resistor 352 close to the sensor electrode 350d fluctuates.

The sensor voltage of the second sensor resistor 352 is input to the MGECU 502 via the controller 650. The MGECU 502 stores a resistance value of the second sensor resistor 352. The MGECU 502 detects the drain current based on the input voltage, the stored resistance value, and the sensor ratio.

The first sensor resistor 342 and the second sensor resistor 352 correspond to sensors.

The gate driver 600 will be described with reference to FIG. 2. FIG. 2 shows a portion in the gate driver 600 that controls the drive of the second opening and closing unit 322. Portions in the gate driver 600 that control the other opening and closing units are the same as the portion shown in FIG. 2. Therefore, the description thereof will be omitted. The gate driver 600 corresponds to a drive circuit.

The gate driver 600 includes a first drive terminal 600a and a second drive terminal 600b. The gate electrode 340c of the IGBT 340 is connected to the first drive terminal 600a. The gate electrode 350c of the MOSFET 350 is connected to the second drive terminal 600b. The gate electrode 340c and the gate electrode 350c correspond to control electrodes.

The gate driver 600 includes a first drive wiring 601 and a second drive wiring 602. One end of the first drive wiring 601 is connected to the first drive terminal 600a. One end of the second drive wiring 602 is connected to the second drive terminal 600b. The other end of the first drive wiring 601 and the other end of the second drive wiring 602 are connected. Accordingly, the first drive terminal 600a and the second drive terminal 600b are connected via the first drive wiring 601 and the second drive wiring 602. That is, the gate electrode 340c and the gate electrode 350c are connected via the first drive wiring 601 and the second drive wiring 602.

The gate driver 600 includes an on-circuit 610, an off-circuit 620, a soft interruption circuit 630, and an off-holding circuit 640 connected to the first drive wiring 601 and the second drive wiring 602. Further, the gate driver 600 further includes the controller 650 that controls the driving of these four circuits.

The control signal of the MGECU 502 is input to the controller 650. The controller 650 generates a drive signal based on the control signal. The controller 650 outputs the drive signal to the switches included in the above four circuits. Accordingly, the voltage levels of the first drive terminal 600a and the second drive terminal 600b are controlled to be a high level or a low level. The on and off states of the IGBT 340 and the MOSFET 350 are controlled.

The gate driver 600 further includes the first sensor terminal 600c and the second sensor terminal 600d. The sensor voltage of the first sensor resistor 342 is input to the first sensor terminal 600c. The sensor voltage of the second sensor resistor 352 is input to the second sensor terminal 600d. These sensor voltages are input to the controller 650. The controller 650 outputs the sensor voltages to the MGECU 502.

The gate driver 600 further includes a threshold voltage generator which is not shown. The threshold voltage generator outputs a threshold voltage to the controller 650. The controller 650 compares the threshold voltage with the sensor voltages. When the sensor voltages are lower than the threshold voltage, the controller 650 controls the drive of the switches included in the above four circuits according to the control signal input from the MGECU 502. However, when the sensor voltages are higher than the threshold voltage, the controller 650 controls the drive of the switches included in the above four circuits without following the control signal input from the MGECU 502.

The on-circuit 610 includes a power supply wiring 611, a power supply 612, an on-switch 613, an on-resistor 614, a first balance resistor 615, and a second balance resistor 616. One end of the power supply wiring 611 is connected to the power supply 612. The other end of the power supply wiring 611 is connected to the other end side of the first drive wiring 601 and the second drive wiring 602 that are connected to each other. The power supply wiring 611 is provided with the on-switch 613 and the on-resistor 614. The on-switch 613 and the on-resistor 614 are sequentially connected in series from the one end to the other end of the power supply wiring 510.

The first balance resistor 615 is provided in the first drive wiring 601. The second balance resistor 616 is provided in the second drive wiring 602. The other end of the power supply wiring 611 is connected between the first balance resistor 615 and the second balance resistor 616.

With the connection configuration described above, the power supply 612 and the first drive terminal 600a are connected via the on-switch 613, the on-resistor 614, and the first balance resistor 615. The power supply 612 and the second drive terminal 600b are connected via the on-switch 613, the on-resistor 614, and the second balance resistor 616. The first balance resistor 615 and the second balance resistor 616 function to adjust the time constant between the power supply 612 and the gate electrodes.

The on-switch 613 is a P-channel MOSFET. The drive signal of the controller 650 is input to a gate electrode of the on-switch 613. Accordingly, an on-off state of the on-switch 613 is controlled.

When the on-switch 613 transitions from the off-state to the on-state, the voltage (power supply voltage) of the power supply 612 via the on-resistor 614 and the first balance resistor 615 is applied to the first drive terminal 600a. Accordingly, the voltage of the gate electrode 340c becomes a high level. The IGBT 340 tends to transition from the off-state to the on-state. Similarly, when the on-switch 613 transitions from the off-state to the on-state, the power supply voltage via the on-resistor 614 and the second balance resistor 616 is applied to the second drive terminal 600b. Accordingly, the voltage of the gate electrode 350c becomes a high level. The MOSFET 350 tends to transition from the off-state to the on-state.

The off-circuit 620 includes a first ground wiring 621, a second ground wiring 622, a first common wiring 623, a first diode 624, a second diode 625, a first off-resistor 626, and a first off-switch 627. Further, the off-circuit 620 further includes the first balance resistor 615 and the second balance resistor 616. The off-circuit 620 and the on-circuit 610 share the first balance resistor 615 and the second balance resistor 616.

One end of the first ground wiring 621 is connected to a connection point between the first balance resistor 615 and the power supply wiring 611 in the first drive wiring 601. One end of the second ground wiring 622 is connected to a connection point between the second balance resistor 616 and the power supply wiring 611 in the second drive wiring 602. The other end of the first ground wiring 621 and the other end of the second ground wiring 622 are connected.

As a result, the first drive terminal 600a and the second drive terminal 600b are connected via the first drive wiring 601, the first ground wiring 621, the second ground wiring 622, and the second drive wiring 602. That is, the gate electrode 340c and the gate electrode 350c are connected via the first drive wiring 601, the first ground wiring 621, the second ground wiring 622, and the second drive wiring 602. The first balance resistor 615 and the second balance resistor 616 are provided in this path. Therefore, the gate electrode 340c and the gate electrode 350c are connected via the first balance resistor 615 and the second balance resistor 616. The first drive wiring 601 and the first ground wiring 621, and the second drive wiring 602 and the second ground wiring 622 correspond to a plurality of first control wirings.

One end of the first common wiring 623 is connected to the other end side of the first ground wiring 621 and the second ground wiring 622 connected to each other. The other end of the first common wiring 623 is connected to the ground. The ground corresponds to a reference potential.

The first diode 624 is provided in the first ground wiring 621. An anode electrode of the first diode 624 is connected to the connection point of the first ground wiring 621 with the first drive wiring 601. A cathode electrode of the first diode 624 is connected to the connection point of the first ground wiring 621 with the second ground wiring 622. The first diode 624 and the second diode 625 correspond to a plurality of diodes.

The second diode 625 is provided in the second ground wiring 622. An anode electrode of the second diode 625 is connected to the connection point of the second drive wiring 622 with second drive wiring 602. A cathode electrode of the second diode 625 is connected to the connection point of the second ground wiring 622 with the first ground wiring 621.

The first off-resistor 626 and the first off-switch 627 are connected to the first common wiring 623. The first off-resistor 626 and the first off-switch 627 are connected in series from one end to the other end of the first common wiring 623. The first off switch 627 corresponds to a first switch.

With the connection configuration described above, the first drive terminal 600a and the ground are connected via the first balance resistor 615, the first diode 624, the first off-resistor 626, and the first off-switch 627. The second drive terminal 600b and the ground are connected via the second balance resistor 616, the second diode 625, the first off-resistor 626, and the first off-switch 627.

The first off-switch 627 is an N-channel MOSFET. The drive signal of the controller 650 is input to a gate electrode of the first off-switch 627. Accordingly, an on-off state of the first off-switch 627 is controlled.

When the first off-switch 627 transitions from the off-state to the on-state, the first drive terminal 600a is connected to the ground via the first balance resistor 615, the first diode 624, and the first off-resistor 626. Accordingly, the gate electrode 340c is connected to the ground. When an electric charge is accumulated in the gate electrode 340c of the IGBT 340, the electric charge flows to the ground via the first balance resistor 615, the first diode 624, and the first off-resistor 626.

When the first off-switch 627 transitions from the off-state to the on-state, the second drive terminal 600b is connected to the ground via the second balance resistor 616, the second diode 625, and the first off-resistor 626. Accordingly, the gate electrode 350c is connected to the ground. When an electric charge is accumulated in the gate electrode 350c of the MOSFET 350, the electric charge flows to the ground through the second balance resistor 616, the second diode 625, and the first off-resistor 626.

When the first off-switch 627 is turned on, an electric charge (current) tends to flow to the first off-switch 627. Therefore, a current tends to flow between the gate electrode 340c and the gate electrode 350c via the first balance resistor 615 and the second balance resistor 616.

However, the first diode 624 is provided in the first ground wiring 621. The second diode 625 is provided in the second ground wiring 622. Therefore, the electric conduction between the gate electrode 350c and the gate electrode 340c can be suppressed. That is, the electric conduction from the gate electrode 350c of the MOSFET 350 to the gate electrode 340c of the IGBT 340 can be suppressed by the first diode 624 in a reverse connection mode with respect to the electric conduction direction. The electric conduction from the gate electrode 340c of the IGBT 340 to the gate electrode 350c of the MOSFET 350 can be suppressed by the second diode 625 in a reverse connection mode with respect to the electric conduction direction.

The resistance values of the first balance resistor 615 and the second balance resistor 616 are smaller than the resistance values of the third balance resistor 634 and the fourth balance resistor 635. Therefore, by turning on the on-switch 613, the increase in the delay time that occurs when the IGBT 340 and the MOSFET 350 are turned on can be suppressed. By turning on the first off-switch 627, the increase in delay time that occurs when the IGBT 340 and the MOSFET 350 are turned off can be suppressed. Further, according to the magnitude relationship of the above resistance values, a first combined resistance value obtained by combining the resistance values of the first balance resistor

615 and the second balance resistor 616 is smaller than a second combined resistance value obtained by combining the resistance values of the third balance resistor 634 and the fourth balance resistor 635.

The soft interruption circuit 630 includes a third ground wiring 631, a fourth ground wiring 632, a second common wiring 633, a third balance resistor 634, a fourth balance resistor 635, a second off-resistor 636, and a second off-switch 637.

One end of the third ground wiring 631 is connected to a point in the first drive wiring 601 between the first balance resistor 615 and the first drive terminal 600a. One end of the fourth ground wiring 632 is connected to a point in the second wiring 602 between the second balance resistor 616 and the second drive terminal 600b. The other end of the third ground wiring 631 and the other end of the fourth ground wiring 632 are connected. Further, the third balance resistor 634 is provided in the third ground wiring 631. The fourth balance resistor 635 is provided in the fourth ground wiring 632.

The first drive terminal 600a and the second drive terminal 600b are connected via the first drive wiring 601, the third ground wiring 631, the fourth ground wiring 632, and the second drive wiring 602. That is, the gate electrode 340c and the gate electrode 350c are connected via the first drive wiring 601, the third ground wiring 631, the fourth ground wiring 632, and the second drive wiring 602. The third balance resistor 634 and the fourth balance resistor 635 are provided in this path. Therefore, the gate electrode 340c and the gate electrode 350c are connected via the third balance resistor 634 and the fourth balance resistor 635. The third ground wiring 631 and the fourth ground wiring 632 correspond to a plurality of second control wirings.

One end of the second common wiring 633 is connected to the other end side of the third ground wiring 631 and the fourth ground wiring 632 which are connected to each other. The other end of the second common wiring 633 is connected to the ground.

The second off-resistor 636 and the second off-switch 637 are connected to the second common wiring 633. The second off-resistor 636 and the second off-switch 637 are sequentially connected in series from one end to the other end of the second common wiring 633. The second off-switch 637 corresponds to the second switch.

With the connection configuration described above, the first drive terminal 600a and the ground are connected via the third balance resistor 634, the second off-resistor 636, and the second off-switch 637. The second drive terminal 600b and the ground are connected via the fourth balance resistor 635, the second off-resistor 636, and the second off-switch 637. The third balance resistor 634 and the fourth balance resistor 635 function to adjust the time constant between the gate electrodes and the ground.

The second off-switch 637 is an N-channel MOSFET. The drive signal of the controller 650 is input to a gate electrode of the second off-switch 637. Accordingly, an on-off state of the second off-switch 637 is controlled.

When the second off-switch 637 transitions from the off-state to the on-state, the first drive terminal 600a is connected to the ground via the third balance resistor 634 and the second off-resistor 636. Accordingly, the gate electrode 340c is connected to the ground. When an electric charge is accumulated in the gate electrode 340c of the IGBT 340, the electric charge flows to the ground via the third balance resistor 634 and the second off-resistor 636.

When the second off-switch 637 transitions from the off-state to the on-state, the second drive terminal 600b is connected to the ground via the fourth balance resistor 635 and the second off-resistor 636. Accordingly, the gate electrode 350c is connected to the ground. When an electric charge is accumulated in the gate electrode 350c of the MOSFET 350, the electric charge flows to the ground via the fourth balance resistor 635 and the second off-resistor 636.

The second off-resistor 636 has a higher resistance value than the first off-resistor 626. The third balance resistor 634 and the fourth balance resistor 635 have higher resistance values than the first balance resistor 615 and the second balance resistor 616. Therefore, when the second off switch 637 is turned on, the electric charge accumulated in the IGBT 340 and the MOSFET 350 flow to the ground gently as compared with the case when the first off-switch 627 is turned on. Therefore, the transitions of the IGBT 340 and the MOSFET 350 from the on-state to the off-state become gentle. The time change of the current (collector current) flowing between the collector electrode 340a and the emitter electrode 340b of the IGBT 340 becomes gentle. The time change of the current (drain current) flowing between the drain electrode 350a and the source electrode 350b of the MOSFET 350 becomes gentle.

Therefore, even in a case of a fault in which the collector current and the drain current are excessively large, the generation of surge voltage in the IGBT 340 and the MOSFET 350 can be suppressed. Further, by suppressing the generation of the surge voltage, it is possible to suppress current from flowing into the gate electrode 340c through the parasitic capacitance between the collector and the gate of the IGBT 340. Similarly, current can be suppressed from flowing into the gate electrode 350c through the parasitic capacitance between the drain and the gate of the MOSFET 350.

The gate electrode 340c and the gate electrode 350c are connected via the first drive wiring 601, the third ground wiring 631, the fourth ground wiring 632, and the second drive wiring 602. When the second off-switch 637 is turned on, current flows through these wirings. At this time, there is a possibility that parasitic resonance due to the parasitic inductance of these wirings and the parasitic capacitance of the gate electrodes may occur between the gate electrode 340c and the gate electrode 350c.

The third balance resistor 634 is provided in the third ground wiring 631. The fourth balance resistor 635 is provided in the fourth ground wiring 632. Therefore, the gate electrode 340c and the gate electrode 350c are connected via the third balance resistor 634 and the fourth balance resistor 635.

The third balance resistor 634 and the fourth balance resistor 635 have higher resistance values than the first balance resistor 615 and the second balance resistor 616. Therefore, the second combined resistance value obtained by combining the resistance values of the third balance resistor 634 and the fourth balance resistor 635 is higher than the first combined resistance value obtained by combining the resistance values of the first balance resistor 615 and the second balance resistor 616. Accordingly, the occurrence of parasitic resonance between the gate electrode 340c and the gate electrode 350c can be suppressed.

The off-holding circuit 640 includes a fifth ground wiring 641, a sixth ground wiring 642, a third common wiring 643, and a third off-switch 644.

One end of the fifth ground wiring 641 is connected to a point in the first drive wiring 601 between the first balance resistor 615 and the first drive terminal 600a. More specifically, the one end of the fifth ground wiring 641 is connected between the connection point with the third ground wiring 631 in the first drive wiring 601 and the first drive terminal 600a. The fifth ground wiring 641 and the sixth ground wiring 642 correspond to a plurality of third control wirings.

One end of the sixth ground wiring 642 is connected to a point in the second drive wiring 602 between the second balance resistor 616 and the second drive terminal 600b. More specifically, the one end of the sixth ground wiring 642 is connected between the connection point with the fourth ground wiring 632 in the second drive wiring 602 and the second drive terminal 600b. The other end of the fifth ground wiring 641 and the other end of the sixth ground wiring 642 are connected.

One end of the third common wiring 643 is connected to the other end side of the fifth ground wiring 641 and the sixth ground wiring 642 connected to each other. The other end of the third common wiring 643 is connected to the ground. The third off-switch 644 is provided in the third common wiring 643. The third off switch 644 corresponds to a third switch.

With the connection configuration described above, the first drive terminal 600a and the ground are connected via the third off-switch 644. The second drive terminal 600b and the ground are connected via the third off-switch 644.

The third off-switch 644 is an N-channel MOSFET. The drive signal of the controller 650 is input to a gate electrode of the third off-switch 644. Accordingly, an on-off state of the third off-switch 644 is controlled.

When the third off-switch 644 transitions from the off-state to the on-state, the first drive terminal 600a and the second drive terminal 600b are connected to the ground with low impedance. Accordingly, the gate electrode 340c and the gate electrode 350c are connected to the ground potential with low impedance. The IGBT 340 and the MOSFET 350 are fixed (held) in the off-state.

The drive control of the IGBT 340 and the MOSFET 350 will be briefly described.

The controller 650 controls the drive of the switches of the above four circuits according to the magnitude relationship between the sensor voltage and the threshold voltage. When the sensor voltages are lower than the threshold voltage, it can be considered that a fault has not occurred in the IGBT 340 and the MOSFET 350. In this case, the controller 650 controls the drive of the switches of the four circuits according to the control signal of the MGECU 502. When at least one of the sensor voltages is higher than the threshold voltage, it can be considered that a fault has occurred in at least one of the IGBT 340 and the MOSFET 350. In this case, the controller 650 controls the drive of the switches of the four circuits without following the control signal of the MGECU 502.

In the following description, the drive control of the switches of the four circuits when the sensor voltages are lower than the threshold voltage is referred to as normal control. The drive control of the switches of the four circuits when at least one of the sensor voltages is higher than the threshold voltage is referred to as emergency control. The above-described fault determination of the IGBT 340 and the MOSFET 350 may be performed by the MGECU 502 instead of the controller 650. Then, in the emergency control, the controller 650 may control the drive of the switches of the four circuits according to the control signal of the MGECU 502.

In the normal control, the controller 650 controls on-off states of the on-switch 613, the first off-switch 627, and the third off-switch 644 according to the control signal from the MGECU 502. At this time, the second off-switch 637 is in the off-state.

When supplying power to the IGBT 340 and the MOSFET 350, the controller 650 turns on the on-switch 613. Accordingly, the power supply voltage is applied to the gate electrode 340c of the IGBT 340 and the gate electrode 350c of the MOSFET 350. The IGBT 340 and the MOSFET 350 become the on-state. Current flows through both the IGBT 340 and the MOSFET 350.

When stopping the power supply to the IGBT 340 and the MOSFET 350, the controller 650 turns off the on-switch 613 and turns on the first off-switch 627. Accordingly, the electric charge accumulated in the gate electrode 340c flows to the ground via the first balance resistor 615 and the first off-resistor 626. The electric charge accumulated in the gate electrode 350c flows to the ground via the second balance resistor 616 and the first off resistor 626. The IGBT 340 and the MOSFET 350 transition from the on-state to the off-state.

When fixing the off-states of the IGBT 340 and the MOSFET 350, the controller 650 turns on the third off-switch 644. Accordingly, the gate electrode 340c and the gate electrode 350c are connected to the ground with low impedance. The IGBT 340 and the MOSFET 350 are fixed in the off-state.

In the emergency control, the controller 650 controls the on-off states of the on-switch 613, the second off-switch 637, and the third off-switch 644 without following the control signal from the MGECU 502. At this time, the first off-switch 627 is in the off-state.

For example, suppose that the sensor voltages exceed the threshold voltage when both the IGBT 340 and the MOSFET 350 are in the on-state. At this time, the controller 650 stops the power supply to the IGBT 340 and the MOSFET 350. That is, the controller 650 turns off the on-switch 613 and turns on the second off-switch 637.

Accordingly, the electric charge accumulated in the IGBT 340 flows to the ground via the third balance resistor 634 and the second off-resistor 636. The electric charge accumulated in the MOSFET 350 flows to the ground via the fourth balance resistor 635 and the second off resistor 636.

The second off-resistor 636 has the higher resistance value than the first off-resistor 626. Therefore, the transitions of the IGBT 340 and the MOSFET 350 from the on-state to the off-state become gentle. Even if a fault in which a large current flows to the IGBT 340 and the MOSFET 350 occurs, it is possible to suppress a steep time change in the current flowing through the IGBT 340 and the MOSFET 350. As a result, the generation of surge voltage in the IGBT 340 and the MOSFET 350 can be suppressed.

The second combined resistance value obtained by combining the resistance values of the third balance resistor 634 and the fourth balance resistor 635 is higher than the first combined resistance value obtained by combining the resistance values of the first balance resistor 615 and the second balance resistor 616. Therefore, the occurrence of parasitic resonance between the gate electrode 340c and the gate electrode 350c can be suppressed.

After a predetermined time has elapsed after turning off the on-switch 613 and turning on the second off-switch 637, the controller 650 turns on the third off-switch 644. Accordingly, the gate electrodes of the IGBT 340 and the MOSFET 350 are connected to the ground with low impedance. Each of the IGBT 340 and the MOSFET 350 is fixed in the off-state. The above-described predetermined time corresponds to a time when the electric charges of the IGBT 340 and the MOSFET 350 can be regarded as having completely flowed to the ground.

Hereinafter, an example of the operation and effects of the gate driver 600 according to the present embodiment will be described.

In emergency control where the sensor voltages are higher than the threshold voltage, the controller 650 turns on (close) the second off-switch 637. At this time, current tends to flow between the gate electrode 340c and the gate electrode 350c via the third balance resistor 634 and the fourth balance resistor 635.

The second combined resistance value obtained by combining the resistance values of the third balance resistor 634 and the fourth balance resistor 635 is higher than the first combined resistance value obtained by combining the resistance values of the first balance resistor 615 and the second balance resistor 616. Therefore, the occurrence of parasitic resonance due to the capacitance of the gate electrodes and the inductance of the wiring can be suppressed between the gate electrode 340c and the gate electrode 350c via the third balance resistor 634 and the fourth balance resistor 635. As a result, the occurrence of overvoltage and a fault in the IGBT 340 and the MOSFET 350 can be suppressed. Damage to the IGBT 340 and MOSFET 350 can be suppressed.

In normal control in which the sensor voltages are lower than the threshold voltage, the controller 650 controls the on-off states of the on-switch 613 and the first off-switch 627. When the on-switch 613 is turned on, the power supply voltage is applied to the gate electrode 340c of the IGBT 340 via the on-resistor 614 and the first balance resistor 615. The power supply voltage is applied to the gate electrode 350c of the MOSFET 350 via the on-resistor 614 and the second balance resistor 616.

When the first off-switch 627 is turned on, the electric charge accumulated in the gate electrode 340c of the IGBT 340 flows to the ground via the first balance resistor 615 and the first off-resistor 626. The electric charge accumulated in the gate electrode 350c of the MOSFET 350 flows to the ground via the second balance resistor 616 and the first off resistor 626.

The first off-resistor 626 has the lower resistance value than the second off-resistor 636. The resistance values of the first balance resistor 615 and the second balance resistor 616 are smaller than the resistance values of the third balance resistor 634 and the fourth balance resistor 635. Therefore, in normal control, it is possible to suppress an increase in the time (delay time) required for transitioning the IGBT 340 and the MOSFET 350 to the on-state or the off-state.

The cathode electrode of the first diode 624 provided in the first ground wiring 621 and the cathode electrode of the second diode 625 provided in the second ground wiring 622 are connected to each other. The anode electrode of the first diode 624 is connected to the gate electrode 340c via the first balance resistor 615. The anode electrode of the second diode 625 is connected to the gate electrode 350c via the second balance resistor 616.

Due to this connection form, the electric conduction from the gate electrode 350c to the gate electrode 340c can be suppressed by the first diode 624. The electric conduction from the gate electrode 340c to the gate electrode 350c can be suppressed by the second diode 625. Therefore, instability of the transitions of the IGBT 340 and the MOSFET 350 from the on-state to the off-state can be suppressed. As a result, instability of the drain current and the collector current can be suppressed.

The gate electrode 340c and the ground are connected via the third off-switch 644. The gate electrode 350c and the ground are connected via the third off-switch 644. Therefore, when the third off-switch 644 is turned on, the gate electrode 340c and the gate electrode 350c are connected to the ground with low impedance. Accordingly, the off-states of the IGBT 340 and the MOSFET 350 are maintained.

Second Embodiment

A second embodiment will be described. A gate driver 600 according to each of the following embodiments has much in common with those according to the above-described embodiments. Therefore, hereinafter, a description of similar portions will be omitted, and different portions will be mainly described. Further, in the following description, the same reference numerals are given to the same elements as those described in the above-described embodiments.

In the first embodiment, an example is described in which the soft interruption circuit 630 includes the second off-resistor 636. On the other hand, in the present embodiment, the soft interruption circuit 630 does not include the second off-resistor 636.

However, the resistance value each of the third balance resistor 634 and the fourth balance resistor 635 is higher than the added resistance value obtained by adding the resistance values of the first off-resistor 626, the first balance resistor 615, and the second balance resistor 616.

According to this configuration, even if the soft interruption circuit 630 does not include the second off-resistor 636, by turning on the second off-switch 637, each of the gate electrode 340c and the gate electrode 350c is connected to the ground with high impedance. As a result, when the second off-switch 637 is turned from the off-state to the on-state, sudden transitions from the on-state to the off-state of the IGBT 340 and the MOSFET 350 are suppressed. Sudden changes in collector current and drain current are suppressed. As a result, the generation of surge voltage in the IGBT 340 and the MOSFET 350 can be suppressed.

The present configuration and the various embodiments and modifications described below also have similar elements and perform similar operations as the above-described embodiments. Therefore, similar effects can be obtained.

Third Embodiment

A third embodiment will be described.

In the first embodiment, the magnitude relationship between the resistance values of the third balance resistor 634 and the fourth balance resistor 635 is not particularly mentioned. The resistance values of these two balance resistors can be changed according to turn-on delay times and a turn-off delay times (i. e., switching speeds), and withstand current performances of power transistors that are connected.

The IGBT 340 is made of Si. The MOSFET 350 is made of SiC. Therefore, the MOSFET 350 has a higher withstand current performance than the IGBT 340. Furthermore, the MOSFET 350 has a shorter turn-on delay time and a shorter turn-off delay time than the IGBT 340.

In this case, the fourth balance resistor 635 provided between the gate electrode 350c of the MOSFET 350 and the ground may have a lower resistance value than the third balance resistor 634 provided between the gate electrode 340c of the IGBT 340 and the ground. Accordingly, the deterioration of the characteristics of the MOSFET 350 manufactured of SiC, which is that the turn-on delay time and the turn-off delay time are short, can be suppressed. Further, even if a momentary surge voltage is generated in the MOSFET 350 as a result of the transition from the off-state to the on-state of the MOSFET 350 when the second off switch 637 is turned on, a fault in the MOSFET 350 can be suppressed.

Fourth Embodiment

A fourth embodiment will be described.

In the first embodiment, the magnitude relationship between the input capacities of the IGBT 340 and the MOSFET 350 is not particularly mentioned. However, the input capacitances of the IGBT 340 and the MOSFET 350 may be equal or different. Then, the magnitude relationship between the resistance values of the third balance resistor 634 and the fourth balance resistor 635 may be determined according to the magnitude relationship between the input capacitances of these two power transistors.

The input capacitance of the IGBT 340 corresponds to the sum of the capacitance between the collector and the gate and the capacitance between the gate and the emitter. The input capacitance of the MOSFET 350 corresponds to the sum of the capacitance between the drain and the gate and the capacitance between the gate and the source.

The amount of current flowing through the power transistor due to parasitic resonance increases with an increase in the input capacitance. This current can be suppressed when the resistance value of the balance resistor connected to the power transistor having a large input capacitance is increased.

For example, when the IGBT 340 has a larger input capacitance than the MOSFET 350, the resistance value of the third balance resistor 634 is set to be larger than the resistance value of the fourth balance resistor 635. Accordingly, an increase in the amount of current flowing through the gate electrode 340c of the IGBT 340 due to parasitic resonance can be suppressed.

While preferred embodiments of the present disclosure have been described above, the present disclosure is not limited in any way by the embodiments described above, and may be carried out with various modifications without departing from the scope of the subject matter of the present disclosure.

(First Modification)

In each of the above-described embodiment, an example in which the second opening and closing unit 322 has the IGBT 340 and the MOSFET 350 connected in parallel has been described. However, the type of power transistor included in the opening and closing unit is not limited to the above example. For example, the opening and closing unit may include two IGBTs. Alternatively, the opening and closing unit may include two MOSFETs. Furthermore, the type of the power transistor included in the opening and closing unit included in the converter 310 and the type of the power transistor included in the opening and closing unit included in the inverter 320 may be different. The drive method of the power transistor may be voltage drive or current drive.

(Second Modification)

In each of the above-described embodiments, an example in which the opening and closing unit includes two power transistors has been described. However, the number of power transistors included in the opening and closing unit is not limited to the above example. The opening and closing unit may include three or more power transistors connected in parallel. Furthermore, the number of the power transistors included in the opening and closing unit included in the converter 310 and the number of the power transistor included in the opening and closing unit included in the inverter 320 may be different.

(Third Modification)

In each of the above-described embodiments, an example in which the IGBT 340 is made of Si and the MOSFET 350 is made of SiC has been described. However, it is also possible to adopt a configuration in which the IGBT 340 is made of SiC and the MOSFET 350 is made of Si. It is also possible to adopt a configuration in which the IGBT 340 and the MOSFET 350 are made of Si. It is also possible to adopt a configuration in which the IGBT 340 and the MOSFET 350 are made of SiC. The materials for forming the power transistors included in the opening and closing unit are not particularly limited. Furthermore, the materials for forming the power transistors included in the opening and closing unit included in the converter 310 and the material for forming the power transistors included in the opening included in the inverter 320 may be different.

(Fourth Modification)

In each of the above-described embodiments, the product form of the gate driver 600 is not particularly mentioned. For example, the gate driver 600 can adopt a configuration in which the on-circuit 610, the off-circuit 620, the soft interruption circuit 630, and the off-holding circuit 640 are included in one IC chip together with the controller 650. Alternatively, the gate driver 600 can adopt a configuration including an IC chip including the controller 650, the on-circuit 610, the off-circuit 620, the soft interruption circuit 630, and an IC chip including the off-holding circuit 640. The inclusion relationship of the elements forming the gate driver 600 with respect to IC chips is not particularly limited.

(Other Modifications)

In each of the above-described embodiments, the gate driver 600 forming the in-vehicle system for the electric vehicle has been described. However, the application of the gate driver is not particularly limited to the above example. For example, the present disclosure can be applied to a gate driver of a hybrid system including a motor and an internal combustion engine.

Figure 3:
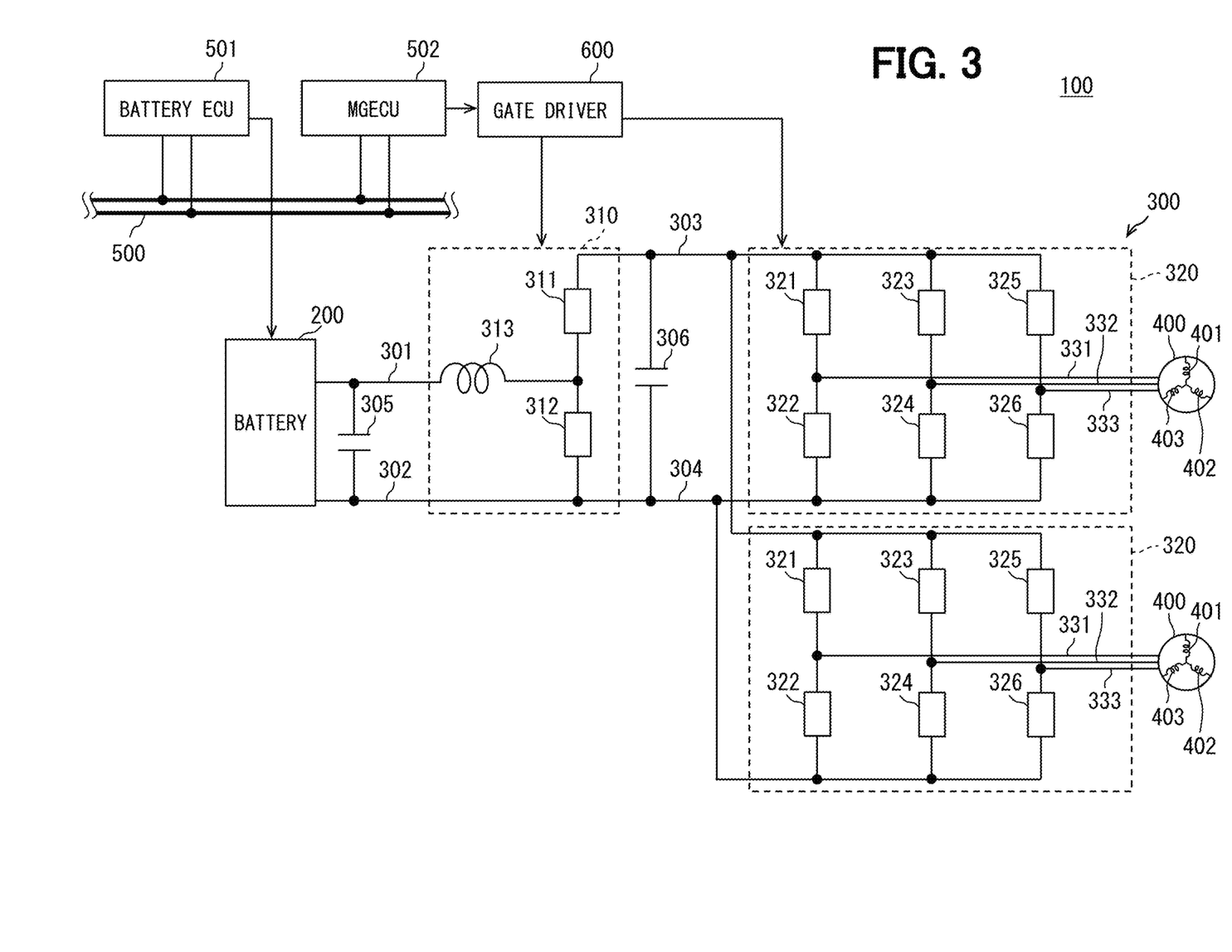
FIG. 3 is a diagram illustrating a modification of the in-vehicle system.

In each of the above-described embodiments, an example in which the power converter 300 includes one converter 310 and one inverter 320 has been described. However, for example, when the in-vehicle system 100 includes two motors 400 as shown in FIG. 3, a configuration in which the power converter 300 includes one converter 310 and two inverters 320 can also be adopted.

In the above, the embodiments, the configurations, the aspects of the driving circuit according to the present disclosure are exemplified. The present disclosure is not limited to the above-described embodiments, each configuration and each aspect related to the present disclosure. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A drive circuit comprising:
   a plurality of first control wirings connected to respective control electrodes of a plurality of controlled switches that are connected in parallel between a first connection point and a second connection point between which there is a potential difference;
   a plurality of first balance resistors provided on the first control wirings, respectively;

a first common wiring connected to the first control wirings in common, and connecting the control electrodes to a reference potential via the first balance resistors, respectively;
a first switch provided on the first common wiring;
a plurality of second control wirings connected to portions of the first control wirings that are connected to ends of the first balance resistors close to the control electrodes, respectively;
a plurality of second balance resistors provided on the second control wirings, respectively;
a second common wiring connected to the second control wirings in common, and connecting the control electrodes to the reference potential via the second balance resistors, respectively;
a second switch provided on the second common wiring;
a sensor configured to detect a fault that has occurred in the controlled switches;
a controller configured to control opening and closing of the first switch when the sensor detects no fault, and control the second switch to be closed when the sensor detects the fault;
a power supply wiring connected to a power supply; and
a plurality of ground wirings provided with a plurality of diodes, respectively, wherein
each of the controlled switches is configured to be opened when the control electrode of each of the controlled switches is connected to the reference potential, and
a resistance value obtained by combining resistance values of the second balance resistors is higher than a resistance value obtained by combining resistance values of the first balance resistors,
the first control wirings are connected between the power supply wiring and the control electrodes, respectively,
the ground wirings have anode-side end portions close to anode electrodes of the diodes and cathode-side end portions close to cathode electrodes of the diodes, respectively,
the anode-side end portions are connected to portions of the first control wirings at positions located between a connection point with the power supply wiring and the first balance resistors, and the anode-side end portions are connected to the first balance resistors, respectively, at a side of the first balance resistors that is opposite to a connection of the control electrodes to the first balance resistors, respectively, and
the cathode-side end portions are connected to the first common wiring.

2. The drive circuit according to claim 1, further comprising:
a plurality of diodes provided on the first control wirings, respectively, in a state where anode electrodes of the diodes are connected to the first balance resistors, respectively.

3. The drive circuit according to claim 2, wherein
the second control wirings are connected to points in the first control wirings located between the first balance resistors and the control electrodes, respectively.

4. The drive circuit according to claim 1, further comprising:
a plurality of third control wirings connected to points in the first control wirings located between the first balance resistors and the control electrodes, respectively;
a third common wiring connected to the third control wirings in common and connecting the control electrodes to the reference potential; and
a third switch provided on the third common wiring.

5. The drive circuit according to claim 1, further comprising:
an off-resistor provided on the first common wiring, wherein
the resistance value of each of the second balance resistors is higher than a sum of a resistance value of the off-resistor and the resistance values of the first balance resistors.

6. The drive circuit according to claim 1, wherein
the controlled switches include an IGBT mainly made of silicon (Si) and a MOSFET mainly made of silicon carbide (SiC).

7. The drive circuit according to claim 6, wherein
the plurality of second balance resistors include a second balance resistor that is connected to the MOSFET and a second balance resistor that is connected to the IGBT,
the second balance resistor that is connected to the MOSFET is provided on a second control wiring connected to a first control wiring, which is connected to a control electrode of the MOSFET,
the second balance resistor that is connected to the IGBT is provided on a second control wiring connected to a first control wiring, which is connected to a control electrode of the IGBT, and
the resistance value of the second balance resistor that is connected to the MOSFET is lower than the resistance value of the second balance resistor that is connected to the IGBT.

8. The drive circuit according to claim 1, wherein
the plurality of controlled switches include a first controlled switch and a second controlled switch,
the first controlled switch has an input capacitance larger than an input capacitance of the second controlled switch,
the plurality of second balance resistors include a second balance resistor that is connected to the first controlled switch and a second balance resistor that is connected to the second controlled switch,
the second balance resistor that is connected to the first controlled switch is provided on a second control wiring connected to a first control wiring, which is connected to a control electrode of the first controlled switch,
the second balance resistor that is connected to the second controlled switch is provided on a second control wiring connected to a first control wiring, which is connected to a control electrode of the second controlled switch, and
the resistance value of the second balance resistor that is connected to the first controlled switch is lower than the resistance value of the second balance resistor that is connected to the second controlled switch.

9. A drive circuit comprising:
a plurality of first control wirings connected to respective control electrodes of a plurality of controlled switches that are connected in parallel between a first connection point and a second connection point between which there is a potential difference;
a plurality of first balance resistors provided on the first control wirings, respectively;
a first common wiring connected to the first control wirings in common, and connecting the control electrodes to a reference potential via the first balance resistors, respectively;
a first switch provided on the first common wiring;

a plurality of second control wirings connected to portions of the first control wirings that are connected to ends of the first balance resistors close to the control electrodes, respectively;

a plurality of second balance resistors provided on the second control wirings, respectively;

a second common wiring connected to the second control wirings in common, and connecting the control electrodes to the reference potential via the second balance resistors, respectively;

a second switch provided on the second common wiring;

a sensor configured to detect a fault that has occurred in the controlled switches;

a first off-resistor provided on the first common wiring between the first switch and a connection point with the plurality of first control wirings, the first off-resistor being the only off-resistor provided on the first common wiring between the first switch and the connection point with the plurality of first control wirings; and a second off-resistor provided on the second common wiring between the second switch and a connection point with the plurality of second control wirings, the second off-resistor being the only off-resistor provided on the second common wiring between the second switch and the connection point with the plurality of second control wirings, wherein a resistance value of the second off-resistor is higher than a resistance value of the first off-resistor; and a controller configured to control opening and closing of the first switch when the sensor detects no fault, and control the second switch to be closed when the sensor detects the fault;

a power supply wiring connected to a power supply; and a plurality of ground wirings provided with a plurality of diodes, respectively, wherein each of the controlled switches is configured to be opened when a control electrode of each of the controlled switches is connected to the reference potential, and a resistance value obtained by combining resistance values of the second balance resistors is higher than a resistance value obtained by combining resistance values of the first balance resistors, the first control wirings are connected between the power supply wiring and the control electrodes, respectively, the ground wirings have anode-side end portions close to anode electrodes of the diodes and cathode-side end portions close to cathode electrodes of the diodes, respectively, the anode-side end portions are connected to portions of the first control wirings at positions located between a connection point with the power supply wiring and the first balance resistors, and the anode-side end portions are connected to the first balance resistors, respectively, at a side of the first balance resistors that is opposite to a connection of the control electrodes to the first balance resistors, respectively, and the cathode-side end portions are connected to the first common wiring.

* * * * *